United States Patent
Tamura (10) Patent No.: US 7,808,021 B2
(45) Date of Patent: Oct. 5, 2010

(54) LATERAL MOSFET AND MANUFACTURING METHOD THEREOF

(75) Inventor: Jun Tamura, Shiga (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/036,907

(22) Filed: Feb. 25, 2008

(65) Prior Publication Data

US 2008/0203472 A1 Aug. 28, 2008

(30) Foreign Application Priority Data

Feb. 27, 2007 (JP) .............................. 2007-046381

(51) Int. Cl.
  *H01L 29/78* (2006.01)
  *H01L 21/336* (2006.01)
(52) U.S. Cl. ............... 257/288; 257/330; 257/E29.262; 257/E21.41; 438/270
(58) Field of Classification Search ............... 257/288
  See application file for complete search history.

(56) References Cited

U.S. PATENT DOCUMENTS

2004/0256666 A1* 12/2004 Fujishima et al. ........... 257/329
2005/0073028 A1*  4/2005 Grant et al. .................. 257/617

FOREIGN PATENT DOCUMENTS

JP   11-103058 A   4/1999
JP   2006-19518 A  1/2006

* cited by examiner

*Primary Examiner*—Zandra Smith
*Assistant Examiner*—Lawrence Tynes, Jr.
(74) *Attorney, Agent, or Firm*—Sughrue Mion, PLLC (57) ABSTRACT

A lateral MOSFET according to the present invention has a trench gate structure having a cross sectional shape spreading toward an open end. The cross sectional shape is T-shape. The T-shaped cross section has a dimensional ratio of a width of a lower trench having a narrow width to a width of an upper trench having a wide width of 1:3, and a dimensional ratio of a depth of the lower trench to a depth of the upper trench of 1:1, the lower trench width having a same central axis as the upper trench width.

7 Claims, 11 Drawing Sheets

LATERAL MOSFET AND MANUFACTURING METHOD THEREOF

BACKGROUND OF THE INVENTION

1. Field of the Invention

The present invention relates to a lateral MOSFET having a trench gate structure and a manufacturing method thereof.

2. Description of Related Art

There is proposed a lateral MOSFET having a trench gate structure as a structure to lower ON resistance by increasing a channel width without increasing an area of an element.

A structure of one example of the lateral MOSFET having a prototype trench gate structure is shown in FIGS. 7A, 7B, 8A, and 8B.

Figure 7A:
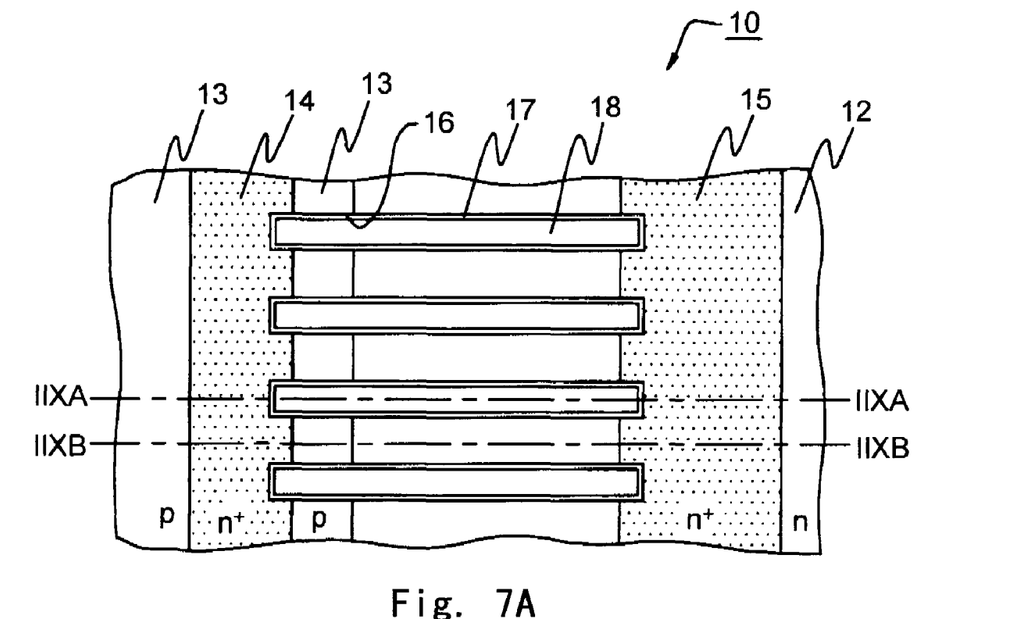
FIGS. 7A and 7B respectively shows a plan view showing one example of a prototype lateral MOSFET and a perspective view of a trench shape.
Figure 7B:
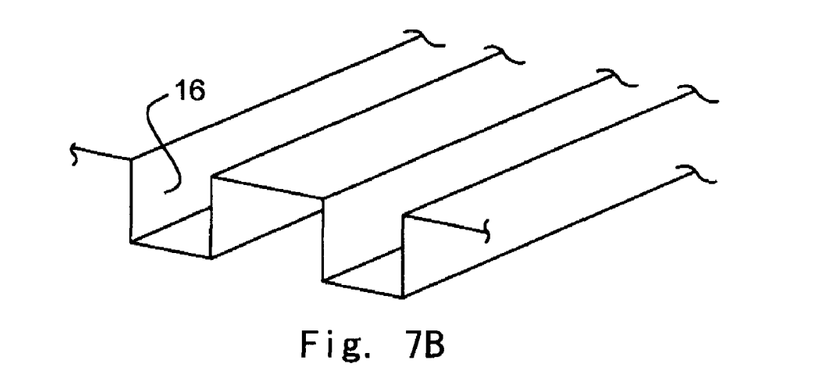
Figure 8A:
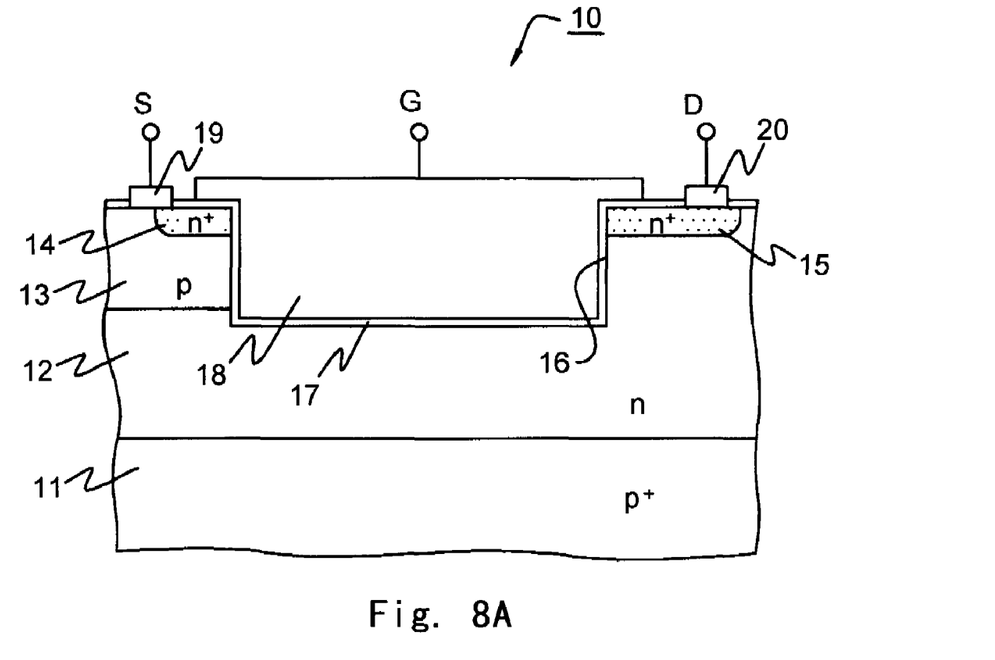
FIGS. 8A and 8B respectively shows a cross sectional view taken along the line IIXA-IIXA and a cross sectional view taken along the line IIXB-IIXB in FIG. 7A.
Figure 8B:
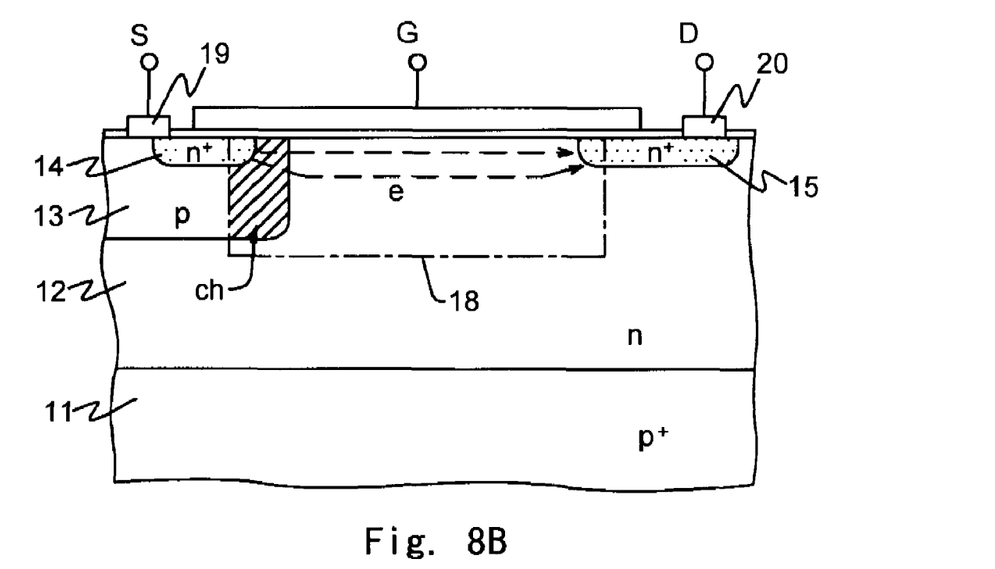

FIG. 7A is a plan view, and FIG. 7B is a perspective view showing a shape of a trench. FIG. 8A is a cross sectional view taken along the line IIXA-IIXA in FIG. 7A. FIG. 8B is a cross sectional view taken along the line IIXB-IIXB in FIG. 7A. FIG. 7A does not include a surface electrode.

In FIGS. 7A, 7B, 8A, and 8B, a prototype lateral MOSFET 10 has a p-type substrate 11, an n-type high-resistance layer 12, a p-type well layer 13, an n-type source layer 14, an n-type drain layer 15, a trench 16, a gate insulation film 17, a gate electrode 18, a source electrode 19, and a drain electrode 20.

The lateral MOSFET 10 has the n-type high-resistance layer 12 formed on the p-type substrate 11.

The stripe-shaped p-type well layer 13 is selectively formed in a predetermined area of the n-type high-resistance layer 12.

The stripe-shaped n-type source layer 14 is selectively formed in a predetermined area in the p-type well layer 13.

The stripe-shaped n-type drain layer 15 is selectively formed in a predetermined area in the n-type high-resistance layer 12 at a position spaced apart from the p-type well layer 13 so as to be parallel to the n-type source layer 14.

In the intermediate region extending from the end portion of the n-type drain layer 15 to the n-type high-resistance layer 12, the p-type well layer 13, and the end portion of the n-type source layer 14, a plurality of trenches 16 are formed extending through the p-type well layer 13 to an intermediate depth of the n-type high-resistance layer 12.

Further, the trenches 16 each have a stripe-like planar shape perpendicular to the n-type source layer 14 and the n-type drain layer 15 and are disposed in parallel to one another.

Further, in the intermediate region between the n-type source layer 14 and the n-type drain layer 15 and in the respective trenches 16, the gate electrode 18 composed of polycrystalline silicon is formed through the gate insulation film 17.

The source electrode 19 is formed on the n-type source layer 14, and the drain electrode 20 is formed on the n-type drain layer 15.

In such a lateral MOSFET 10, if a gate voltage is made larger than the threshold value voltage while applying the predetermined voltage between drain and source, then the p-type well layer 13 which is faced to the gate electrode 18 is inverted into the n conductivity type, so as to form the channel ch (see an area shown in oblique line in FIG. 8B).

Then electrons e are injected from the n-type source layer 14 into the n-type drain layer 15 through the channel ch.

The channel ch is formed not only on the substrate surface but also in a depth direction along with the side surface of the trench 16, which makes it possible to increase the channel width (for example, see FIGS. 1 and 2 of Japanese Unexamined Patent Application Publication No. 11-103058).

Now, a method of forming the trench 16 of the lateral MOSFET 10 will be described. A high-concentration layer including the n-type source layer 14 and the n-type drain layer 15 is formed in a predetermined area. Then a resist mask (not shown) is formed on the substrate. The resist mask has an opening where the trench 16 will be formed. Then an anisotropic etching is performed straightforward to the predetermined depth so as to form the trench 16 having a rectangular cross sectional shape as shown in FIG. 7B.

However, in the lateral MOSFET 10 which is described above, entire channel ch in a depth direction along the side surface of the trench 16 can not effectively contribute to the flow of electrons e.

This is because the depths of the n-type source layer 14 and the n-type drain layer 15 are shallow with respect to the depth of the trench 16 even if the channel ch is formed in the depth direction in the prototype lateral MOSFET. In such a case, instead of bypassing the gate electrode in the depth direction, almost all the electrons e flow in the vicinity of the substrate surface almost linearly from the n-type source layer 14 toward the n-type drain layer 15 as shown in FIG. 8B.

Figure 9A:
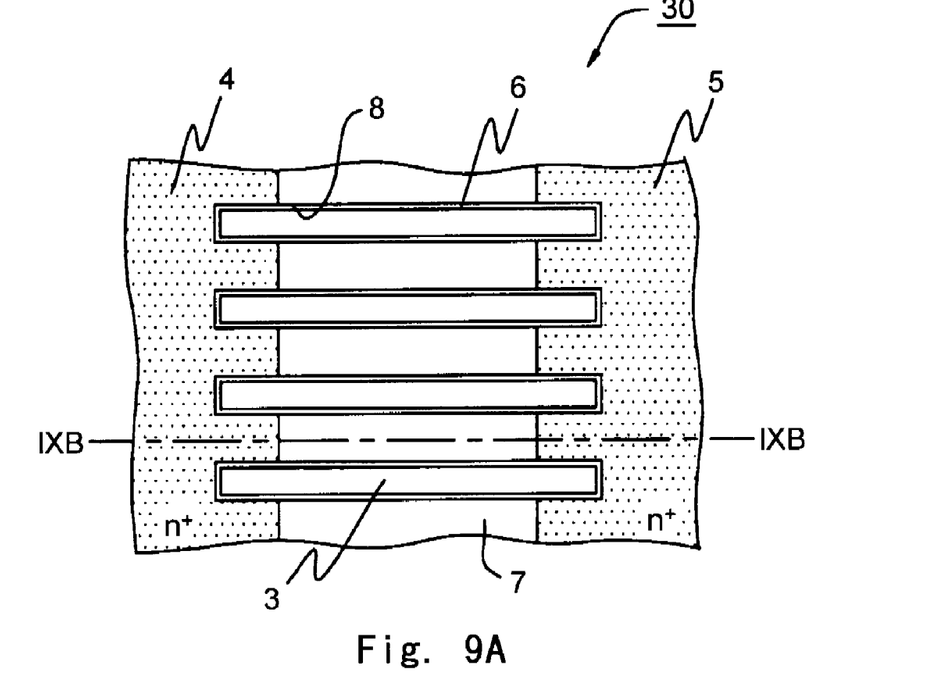
FIGS. 9A and 9B respectively shows a plan view and a cross sectional view taken along the line IXB-IXB showing another example of the prototype lateral MOSFET.
Figure 9B:
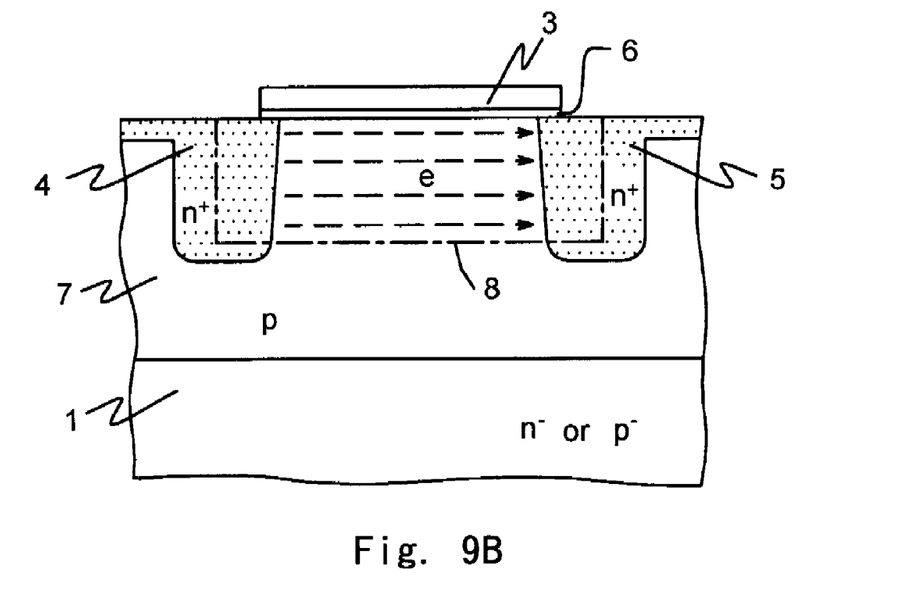

To overcome the above problem, there is proposed a configuration for making the depths of the n-type source layer and the n-type drain layer deeper than the depth of the trench as shown in FIGS. 9A and 9B as a second prototype example.

FIG. 9A is a plan view and FIG. 9B is a cross sectional view taken along the line IXB-IXB in FIG. 9A. FIG. 9A does not include a surface electrode.

In FIGS. 9A and 9B, another prototype lateral MOSFET 30 has a high-resistance semiconductor substrate 1, a gate electrode 3, an n-type source layer 4, an n-type drain layer 5, a gate insulation film 6, a p-type well layer 7, and a trench 8.

In such a lateral MOSFET 30, the n-type source layer 4 and the n-type drain layer 5 are deeply formed as shown in FIG. 9B. Therefore, the channel ch formed in the depth direction along the side surface of the trench 8 effectively contributes to the flow of electrons e.

Note that the method of obliquely implanting ion from the side surface of the trench 8 is employed to form the deeper n-type source layer 4 and the n-type drain layer 5 so as to secure uniformity of ion concentration distribution in the depth direction (see for example FIGS. 1A and 1C of Japanese Unexamined Patent Application Publication No. 2006-19518).

Although the effective channel width is supposed to be increased as the depths of the n-type source layer 4 and the n-type drain layer 5 are increased along with the depth of the trench 8 in such a lateral MOSFET 30, there is a limit in this depth due to reasons as follows.

Figure 10:
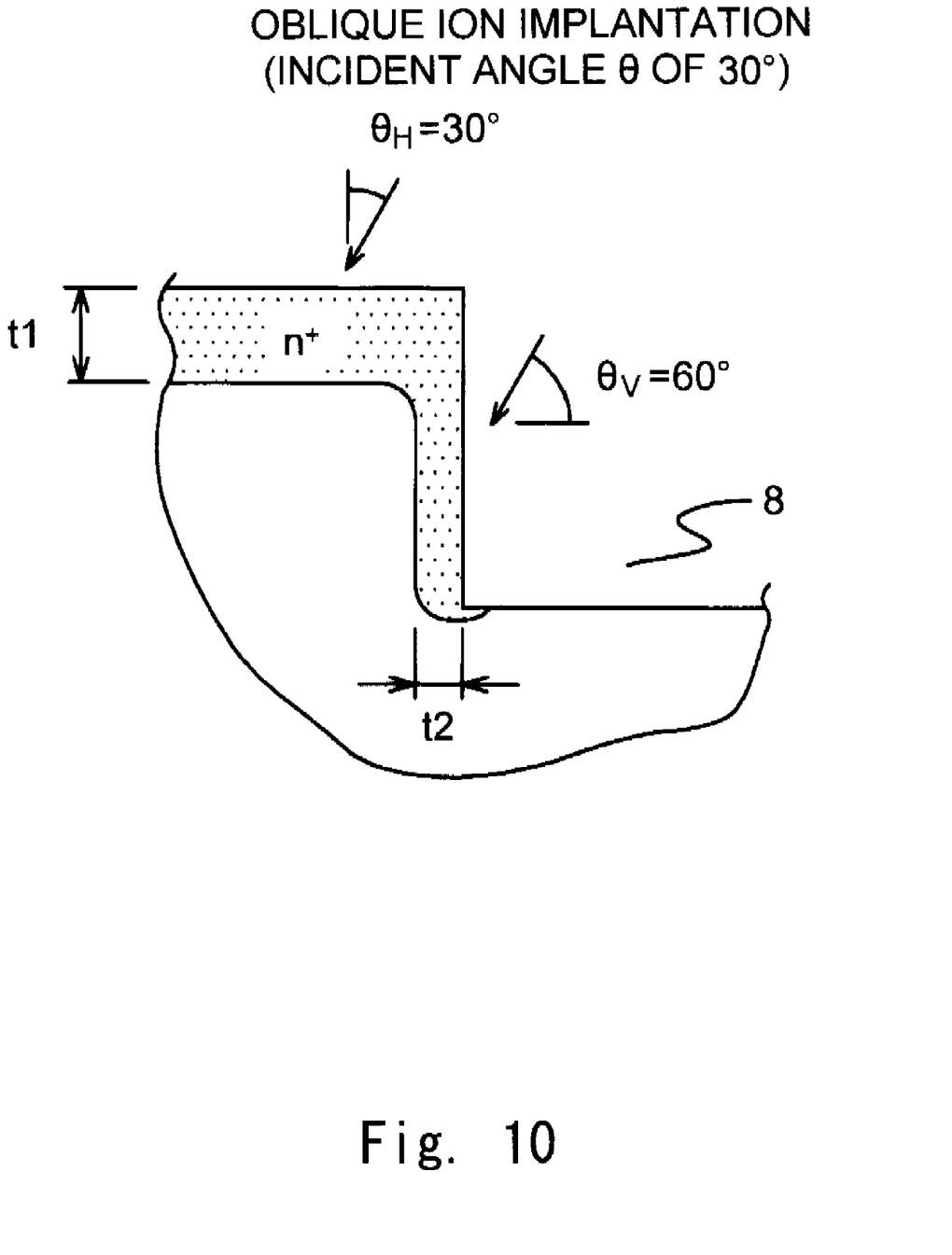
FIG. 10 is a cross sectional view of a trench portion of the prototype lateral MOSFET.

The first reason is that an incident angle $\theta$ of the oblique ion implantation becomes smaller as the depths of the n-type source layer 4 and the n-type drain layer 5 are increased in order to increase the channel width. For example, if the incident angle of the oblique ion implantation $\theta$ is 30°, the incident angle to the trench side surface (vertical surface) $\theta V$ is 60° whereas the incident angle to the substrate surface (horizontal surface) $\theta H$ is 30° as shown in FIG. 10. Therefore, there is a large difference between two incident angles.

As a result, the thickness (t2) of the high-concentration layer formed in the trench side surface (vertical surface) is made thinner compared with the thickness (t1) of the high-concentration layer formed on the substrate surface (horizontal surface), which means t2<t1. Therefore, even when the channel ch is formed in the depth direction, electrons e are not fully supplied from the high-concentration layer or the supplied electrons are made non-uniform, which means the channel ch in the depth direction cannot effectively be used.

The second reason is that there is a limit in the trench depth when there is a buried oxide film such as an SOI substrate (not shown) in the substrate. In such a case, the channel width cannot further be increased.

One object of the present invention is to provide a lateral MOSFET having a trench gate structure and the manufacturing method thereof, thereby making it possible to secure the thicknesses of the source layer and the drain layer deeply formed along the trench and to obtain the wider channel width resulting in decreasing ON resistance.

SUMMARY

According to one aspect of the present invention, there is provided a lateral MOSFET having a trench gate structure having a cross sectional shape spreading toward an open end.

According to another aspect of the present invention, there is provided a manufacturing method of a lateral MOSFET having a trench gate structure having a T-shaped cross section spreading toward an open end, comprising forming a laminated pattern including a first sacrifice film and a resist film disposed on the first sacrifice film on a substrate, the laminated pattern having an opening where an upper trench is formed, forming the upper trench by performing an anisotropic etching to a predetermined depth using the laminated pattern as a mask, forming a side wall made of a second sacrifice film on both sides of the first sacrifice film by forming and etching back the second sacrifice film after removing the resist film, and forming a lower trench by performing an anisotropic etching to the predetermined depth using the first sacrifice film and the side wall as the mask.

According to yet another aspect of the present invention, there is provided a manufacturing method of a lateral MOSFET having a trench gate structure having a V-shaped cross section spreading toward an open end, comprising forming an etching mask of a pattern having an opening where a trench is formed on a silicon substrate, and forming the trench having the V-shaped cross section by performing an anisotropic etching of crystalline in alkaline solutions using the etching mask as the mask.

According to the lateral MOSFET having the trench gate structure and the manufacturing method thereof, it is possible to secure the thicknesses of the source layer and the drain layer deeply formed along the trench and to obtain the wider channel width resulting in decreasing ON resistance.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

One object of the present invention is to provide a lateral MOSFET having a trench gate structure and the manufacturing method thereof, thereby making it possible to secure the thicknesses of the source layer and the drain layer deeply formed along the trench and to obtain the wider channel width resulting in decreasing ON resistance. The present invention has realized this object by providing the trench gate structure having a cross sectional shape spreading toward the open end.

Embodiments

A structure of one example of the lateral MOSFET having a trench gate structure of the present invention is shown in FIGS. 1A, 1B, 2A, 2B, and 4. Note that the same reference symbols are given to the parts identical to FIGS. 7A, 7B, 8A, and 8B.

Figure 1A:
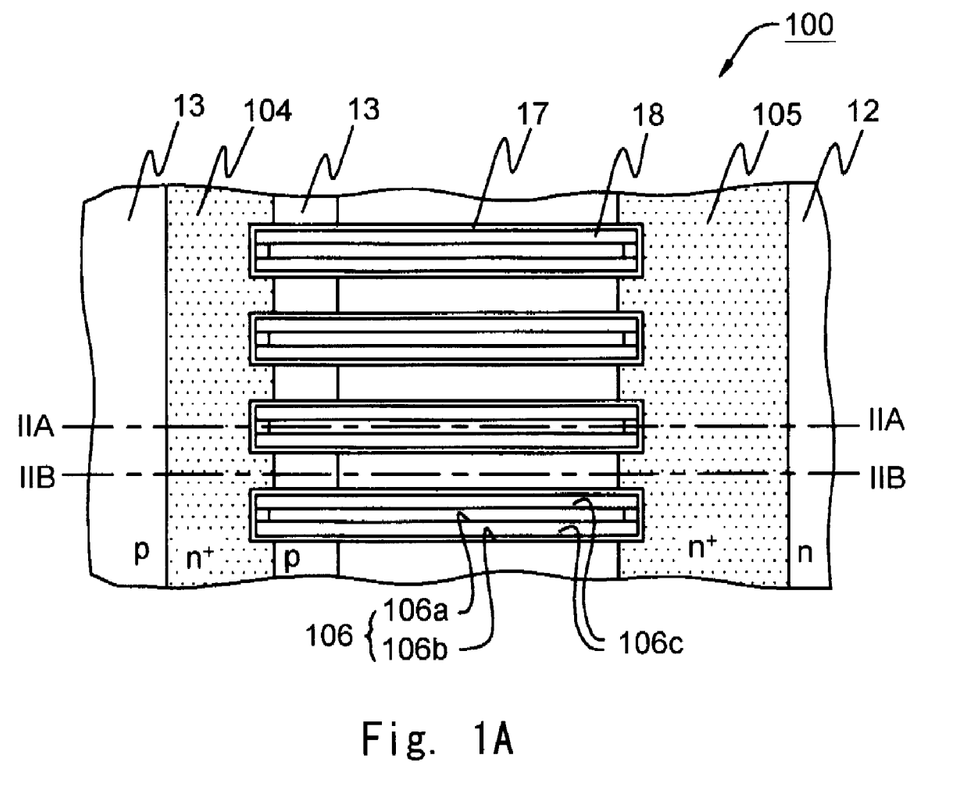
FIGS. 1A and 1B respectively shows a plan view showing one example of a lateral MOSFET of the present invention and a perspective view of a trench shape.
Figure 1B:
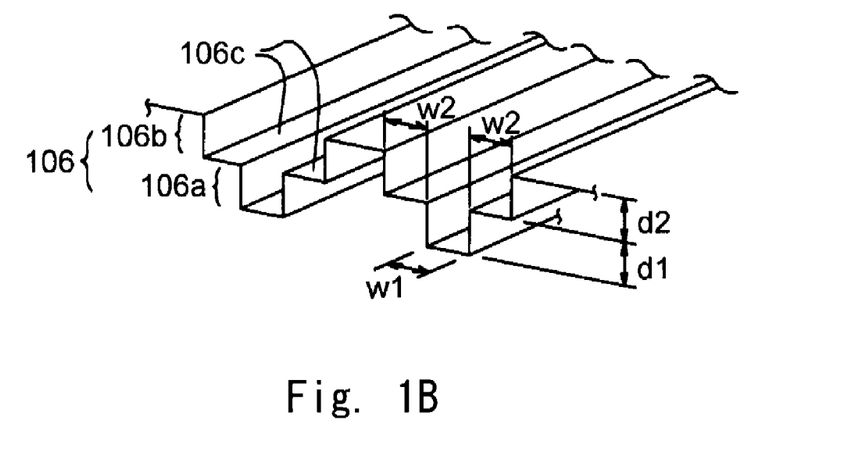
Figure 2A:
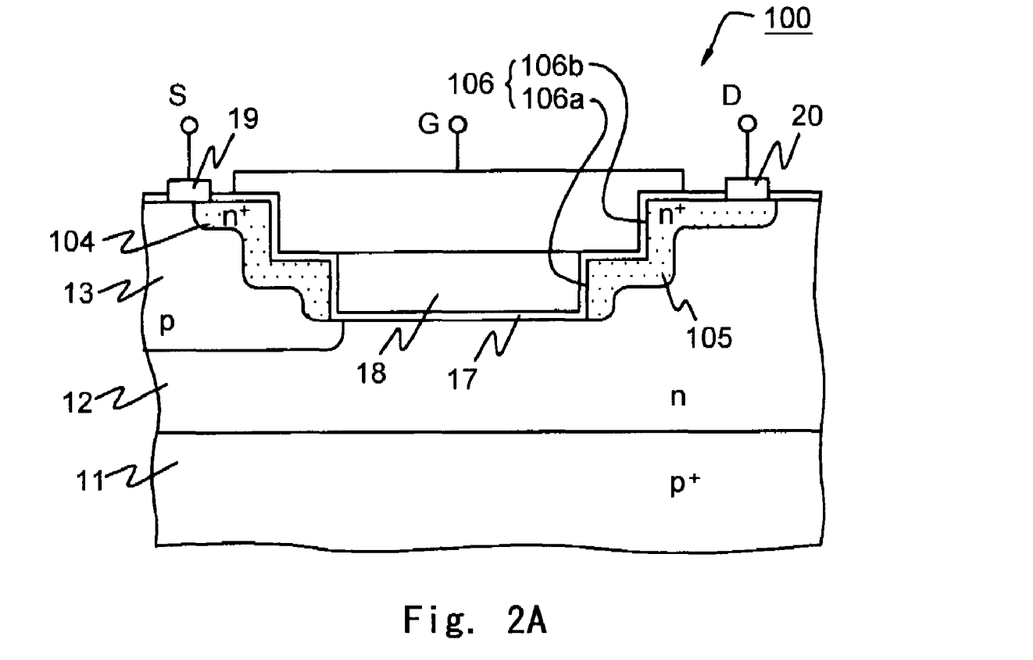
FIGS. 2A and 2B respectively shows a cross sectional view taken along the line IIA-IIA and a cross sectional view taken along the line IIB-IIB in FIG. 1A.
Figure 2B:
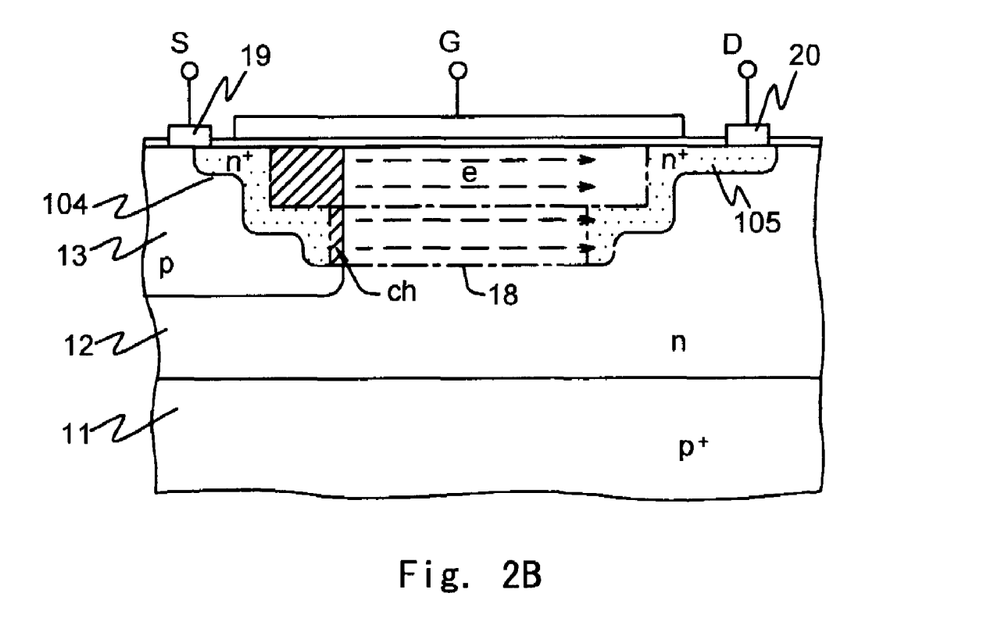
Figure 4:
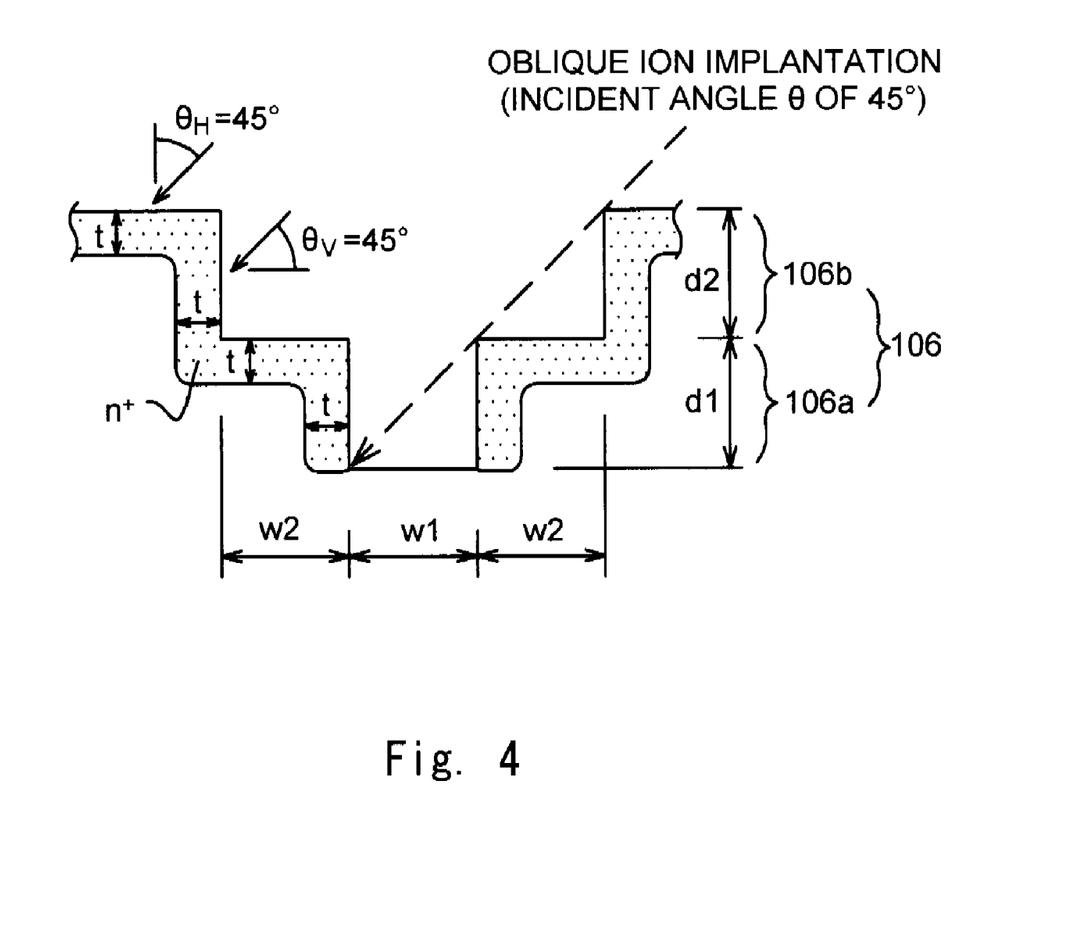
FIG. 4 is a cross sectional view of a trench portion of the lateral MOSFET of the present invention.

FIG. 1A is a plan view and FIG. 1B is a perspective view showing a trench shape. FIG. 2A is a cross sectional view taken along the line IIA-IIA in FIG. 1A. FIG. 2B is a cross sectional view taken along the line IIB-IIB in FIG. 1A. FIG. 4 is a cross sectional view of the trench portion. FIG. 1A does not include a surface electrode.

In FIGS. 1A, 1B, 2A, and 2B, the lateral MOSFET 100 has a p-type substrate 11, an n-type high-resistance layer 12, a p-type well layer 13, an n-type source layer 104, an n-type drain layer 105, a trench 106, a lower trench 106a, an upper trench 106b, 106c is a step surface, a gate insulation film 17, a gate electrode 18, a source electrode 19, and a drain electrode 20. Here, w1 is a lower trench width, w2 is a step surface width, d1 is a lower trench depth, and d2 is an upper trench depth.

The lateral MOSFET 100 has the n-type high-resistance layer 12 formed on the p-type substrate 11.

The stripe-shaped p-type well layer 13 is selectively formed in a predetermined area of the n-type high-resistance layer 12.

The stripe-shaped n-type source layer 104 is selectively formed in a predetermined area in the p-type well layer 13.

The stripe-shaped n-type drain layer 105 is selectively formed in a predetermined area in the n-type high-resistance layer 12 at a position spaced apart from the p-type well layer 13 so as to be parallel to the n-type source layer 104.

In the intermediate region extending from the end portion of the n-type drain layer 105 to the n-type high-resistance layer 12, the p-type well layer 13, and the end portion of the n-type source layer 104, a plurality of trenches 106 are formed extending to an intermediate depth of the n-type high-resistance layer 12 and the p-type well layer 13.

Further, the trenches 106 each have a stripe-like planar shape perpendicular to the n-type source layer 104 and the n-type drain layer 105. The trenches 106 are disposed in parallel to one another.

Further, in the intermediate region between the n-type source layer 104 and the n-type drain layer 105 and in the respective trenches 106, the gate electrode 18 composed of polycrystalline silicon is formed through the gate insulation film 17.

The source electrode 19 is formed on the n-type source layer 104, and the drain electrode 20 is formed on the n-type drain layer 105.

As shown in FIG. 1B, the cross sectional shape of the trench 106 is T-shape spreading toward the open end.

More particularly, two-step configuration is employed including a lower trench 106a having a narrow width and an upper trench 106b having a wide width including step surfaces 106c on both sides thereof. The lower trench width has the same central axis as the upper trench width.

Note that the cross sectional shape of the trench means the cross section when the trench is cut in a surface vertical to the longitudinal direction in this embodiment.

The relationship among the lower trench width (w1), the step surface width (w2), the lower trench depth (d1), and the upper trench depth (d2) is w1=w2=d1=d2.

The channel width (having a length of 2*w2) is formed also along the step surface 106c (horizontal direction) in addition to the channel width (having a length of 2*(d1+d2)) formed along the side surface in the vertical direction of the trench 106. Therefore, the channel width can be increased without greatly increasing the depth of the trench 106.

The depth of the n-type source layer 104 and the depth of the n-type drain layer 105 are substantially the same as the depth of the trench 106.

The thickness of the high-concentration layer formed in the substrate surface (horizontal surface) and the step surface 106c (horizontal surface) and the thickness of the high-concentration layer formed in the vertical surface of the trench 106 are formed to have substantially the same thickness (t) as shown in FIG. 4.

Now, the manufacturing method of the trench of such a lateral MOSFET 100 is described with reference to FIGS. 3A to 3F.

FIGS. 3A to 3F are cross sectional views of the trench portion of the device for each manufacturing step.

Figure 3A:
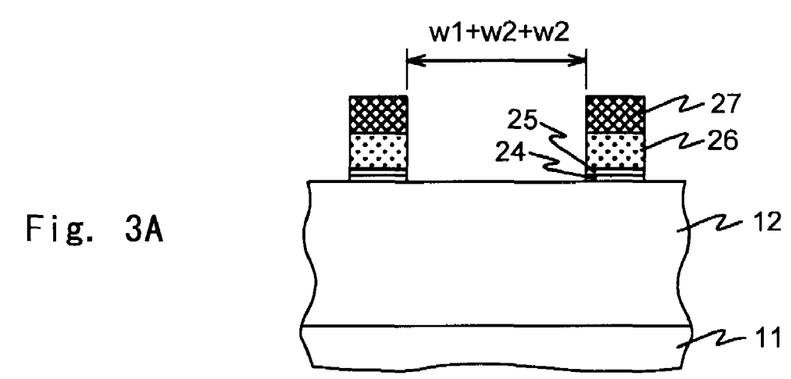
FIGS. 3A to 3F are cross sectional views showing one example of a manufacturing method of the lateral MOSFET of the present invention.

As shown in FIG. 3A, an oxide silicon film 24 and a nitride silicon film 25 are formed on the n-type high-resistance layer 12 which is formed on the p-type substrate 11. Then a polycrystalline silicon film 26 which functions as a first sacrifice film and a resist film 27 are formed on the nitride silicon film 25 in this order. Then a laminated pattern including an opening where an upper trench will be formed is formed by photolithography method and etching.

Note that the pattern interval is formed to be equal to an opening width (w1+w2+w2) of the upper trench 106b and the pattern width is formed to be equal to the interval between elements that are adjacent to each other.

Figure 3B:
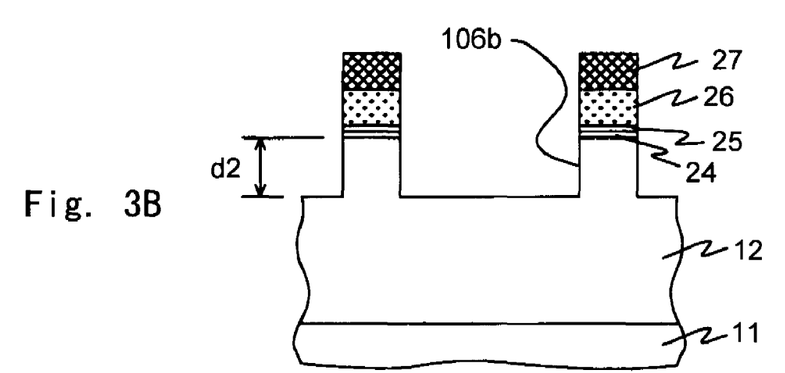

Then, anisotropic etching is performed to the predetermined depth (upper trench depth (d2)) using the laminated pattern as a mask as shown in FIG. 3B.

The upper trench 106b is thus formed.

Figure 3C:
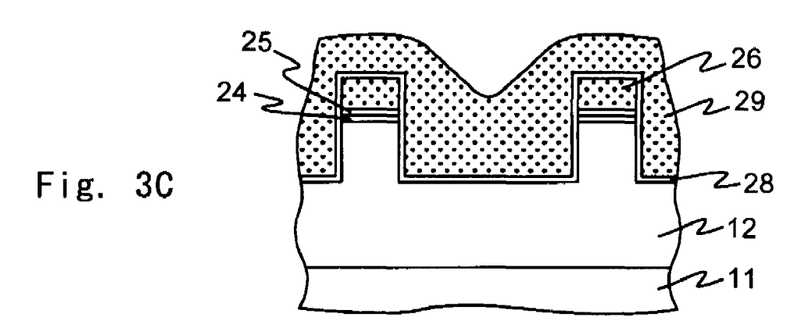

Then the nitride silicon film 28 is formed after removing the resist film 27. Then a polycrystalline silicon film 29 is formed as a second sacrifice film as shown in FIG. 3C.

Figure 3D:
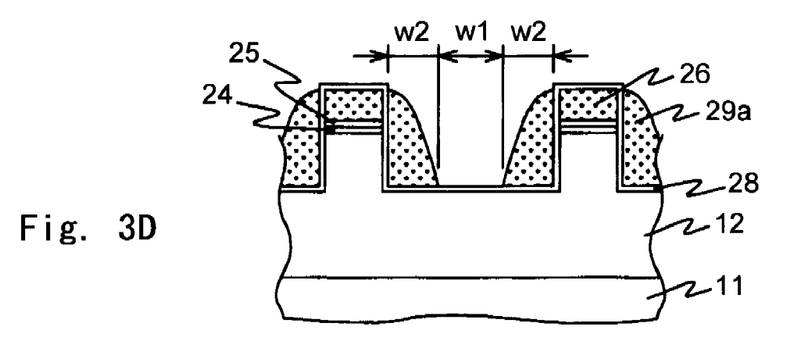

Then the polycrystalline silicon film 29 is etched back to form side wall 29a on both sides of the polycrystalline silicon film 26 as shown in FIG. 3D.

Note that the thickness of the side wall 29a is equal to the width (w2) of the step surface 106c.

The distance between the facing side walls 29a is made equal to the opening width (w1) of the lower trench 106a.

Figure 3E:
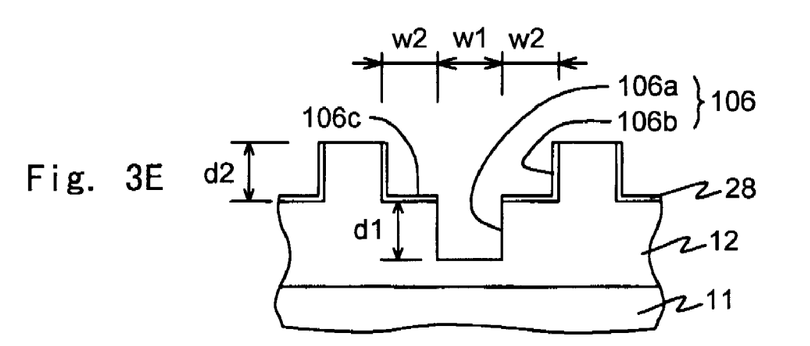

Then anisotropic etching is performed to the predetermined depth (lower trench depth (d1)) using the polycrystalline silicon film 26 and the side wall 29a as the mask as shown in FIG. 3E.

If the side wall 29a remains after performing etching, the side wall 29a is completely removed by wet etching.

The lower trench 106a is thus formed.

The trench 106 having a two-step configuration of the lower trench 106a and the upper trench 106b and having a T-shaped cross section is thus formed.

Note that the relationship among the lower trench width (w1), the step surface width (w2), the lower trench depth (d1), and the upper trench depth (d2) is w1=w2=d1=d2.

By having such a dimensional relationship, it is possible for the ion input from one trench open end with the incident angle θ of 45° (shown in dashed arrow in FIG. 4) to be implanted into the lower end of the other trench side surface as shown in FIG. 4 to form the source layer and the drain layer having substantially the same depth to that of the trench.

Further, the maximum width (w2) of the step surface 106c can be obtained so as not to interrupt ion implantation with the incident angle θ of 45°, thereby making it possible to increase the channel width in a horizontal direction.

After removing the nitride silicon film 25 and the oxide silicon film 24 by etching, the resist mask (not shown) having the predetermined pattern is formed. Then p-type impurities such as boron are implanted into the predetermined area of the n-type high-resistance layer 12 to form the p well area (not shown).

Figure 3F:
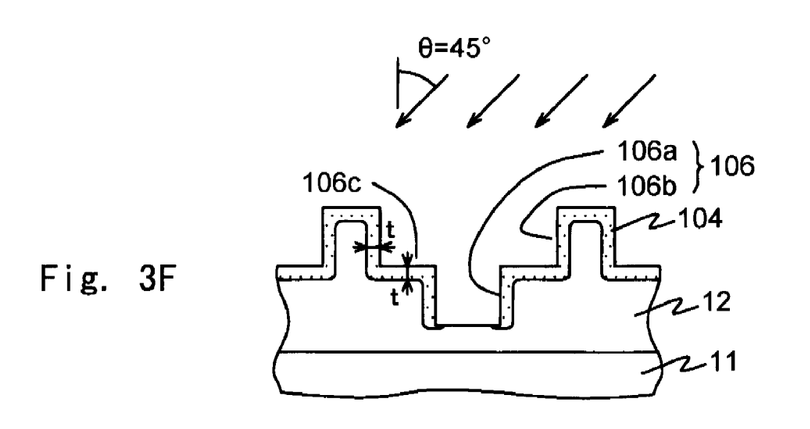

Then, as shown in FIG. 3F, after forming the resist mask (not shown) having the predetermined pattern, the n-type impurities such as phosphorus are implanted into the predetermined area of the n-type high-resistance layer 12 with the incident angle θ of 45° while rotating the substrate to form the n-type source layer 104 and the n-type drain layer (not shown) having substantially the same depth to that of the trench 106 along the side surface of the trench 106.

Both of the ion incident angle θH which is the angle of ion implanted into the substrate surface (horizontal surface) and the step surface 106c (horizontal surface) and the ion incident angle θV which is the angle of ion implanted into the trench side surface (vertical surface) are 45°. Therefore, the thickness of the high-concentration layer formed in the substrate surface (horizontal surface) and the step surface 106c (horizontal surface) and the thickness of the high-concentration layer formed in the side surface of the trench 106 (vertical surface) can be formed to have substantially the same thickness (t).

As a result, the uniform amount of electrons e can be supplied and the effective channel over the side surface of the trench 106 can be obtained.

After forming the gate insulation film (not shown) having the predetermined thickness, the trench 106 is filled up with polycrystalline silicon to form the gate electrode (not shown) The trench gate structure can be thus obtained.

Although the sacrifice film is formed by the polycrystalline silicon film in the above-described embodiment, the sacrifice film may also be formed by Si oxide film or the like by CVD method.

Although the lateral MOSFET 100 is formed on the p-type substrate 11, the SOI substrate having the buried oxide film may also be formed on the substrate in order to decrease the parasitic capacitance between the drain and the source.

Figure 5A:
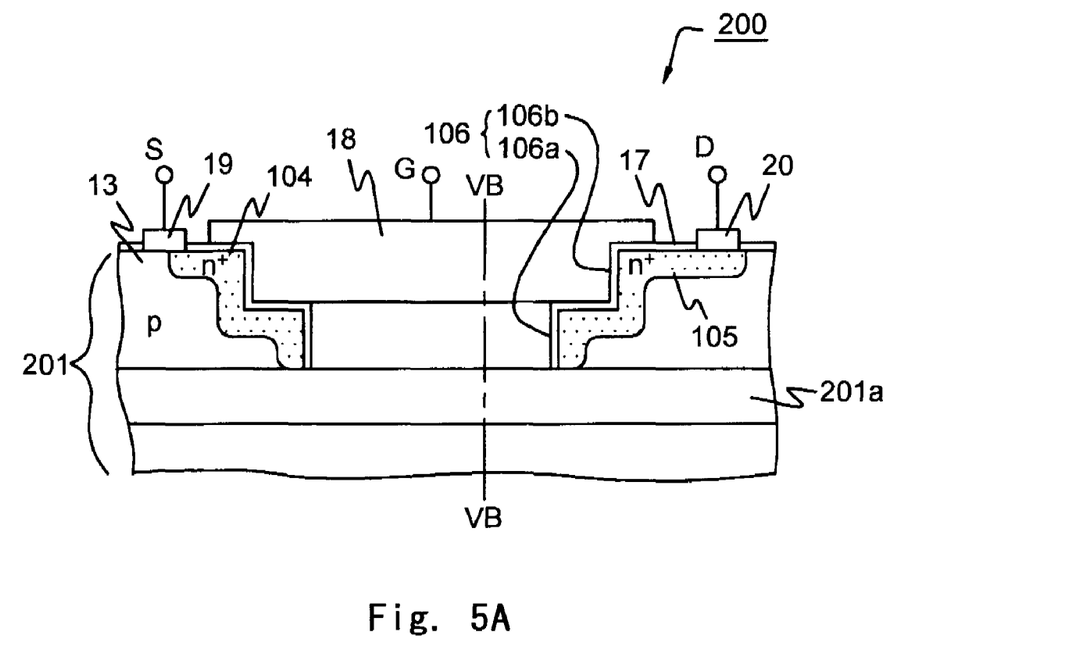
FIGS. 5A and 5B respectively shows a cross sectional view of the lateral MOSFET of the present invention in an SOI substrate and a cross sectional view taken along the line VB-VB in FIG. 5A.
Figure 5B:
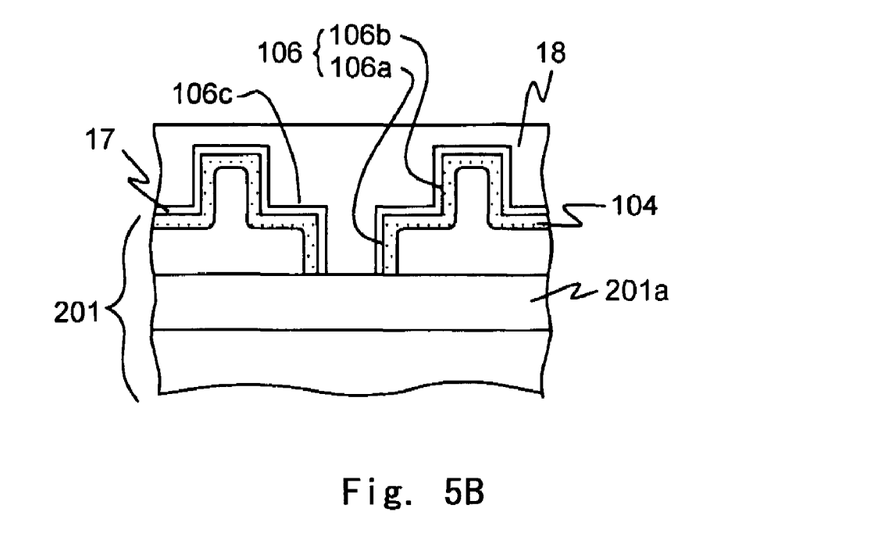

The cross sectional view of such a lateral MOSFET 200 will be shown in FIGS. 5A and 5B. FIG. 5B shows a cross sectional view taken along the line VB-VB in FIG. 5A.

In an SOI substrate 201 in FIGS. 5A and 5B, the depth of the trench cannot be made deeper than that of the lateral MOSFET 100 because there is provided a buried oxide film 201a. Therefore, it is preferable to provide the step surface 106c in the trench to increase the channel width in the horizontal direction.

Figure 6A:
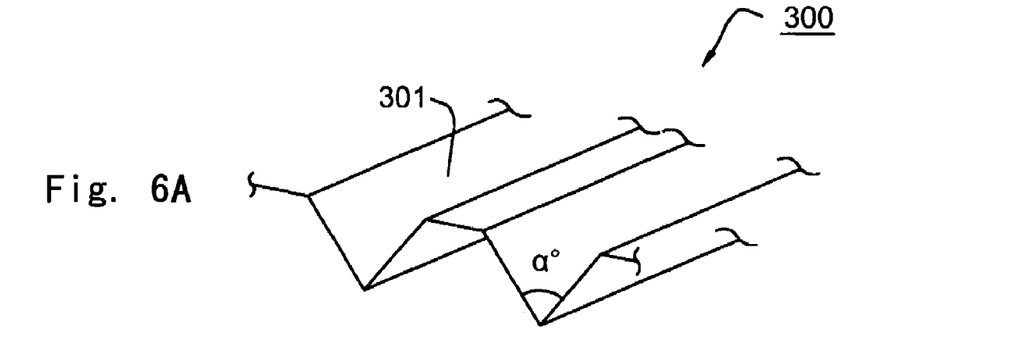
FIGS. 6A to 6C each shows a cross sectional view showing a second embodiment of the lateral MOSFET of the present invention.
Figure 6B:
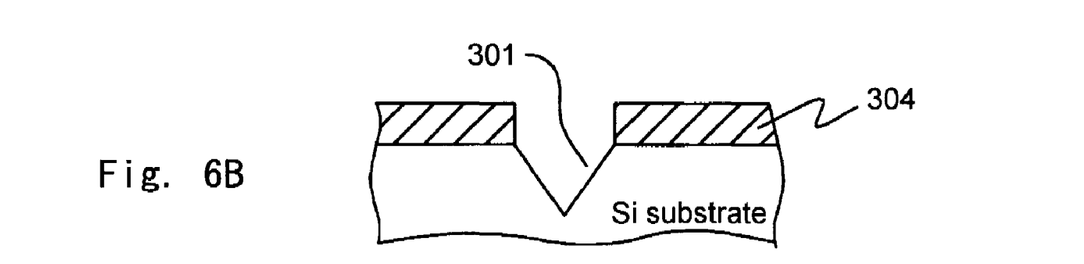
Figure 6C:
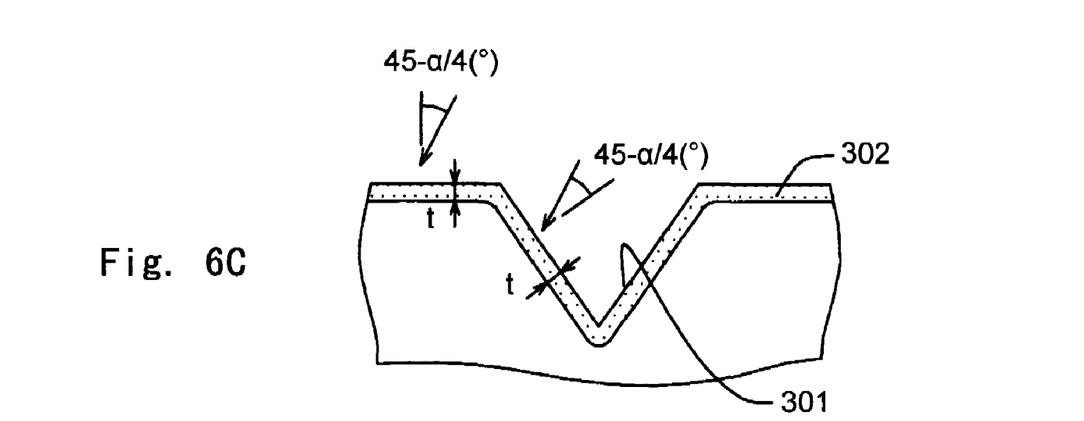

Now, the lateral MOSFET 300 as the second embodiment of the present invention will be shown in FIGS. 6A to 6C.

FIG. 6A is a perspective view of the trench portion. V-shape angle of the trench 301 having the V-shaped cross section is α°.

Note that the channel width is an oblique portion forming V shape. Therefore, the channel width can be made larger compared with the straight length.

The manufacturing method of such a trench 301 is as follows. As shown in FIG. 6B, an etching mask 304 of a pattern having an opening where the trench will be formed is formed on the silicon substrate. Then the anisotropic etching of crystalline in alkaline solutions is performed using the etching mask 304 as the mask to form the trench 301.

When the oblique ion implantation is performed in the trench 301 with the incident angle θ of 45-α/4(°) as shown in FIG. 6C, then the ion incident angle against the substrate surface (horizontal surface) and the ion incident angle against the side surface of the trench 301 (oblique surface) become equal to each other. Therefore, the high-concentration layer 302 (the source layer and the drain layer) having the uniform thickness (t) can be preferably formed.

It is apparent that the present invention is not limited to the above embodiment but it may be modified and changed without departing from the scope and spirit of the invention.

What is claimed is:

1. A lateral MOSFET comprising:
    a semiconductor substrate that has a main surface;
    a gate electrode that is buried in a trench that is formed at the main surface of the semiconductor substrate; and
    source and drain impurities regions that are formed below the main surface of the semiconductor, the source and drain regions sandwiching the trench therebetween,
        wherein the trench includes at least two step portions in its depth direction, the two step portions being dimensioned such that the thicknesses of horizontally extending and vertically extending portions of said source and drain impurities regions are substantially same.

2. The lateral MOSFET according to claim 1, wherein a cross sectional shape of the trench is T-shape.

3. The lateral MOSFET according to claim 2, wherein the T-shaped cross section has a dimensional ratio of a width of a lower trench having a narrow width to a width of an upper trench having a wide width of 1:3, and a dimensional ratio of a depth of the lower trench to a depth of the upper trench of 1:1, the lower trench width having a same central axis as the upper trench width.

4. The lateral MOSFET according to claim 3, wherein the width of the lower trench is substantially same as the depth of the lower trench.

5. The lateral MOSFET according to claim 1, wherein the lateral MOSFET is formed in an SOI substrate.

6. A lateral MOSFET having a trench gate structure having a cross sectional shape spreading toward an open end, wherein the cross sectional shape below the open end is T-shape, and
    the T-shaped cross section has a dimensional ratio of a width of a lower trench having a narrow width to a width of an upper trench having a wide width of 1:3, and a dimensional ratio of a depth of the lower trench to a depth of the upper trench of 1:1, the lower trench width having a same central axis as the upper trench width, whereby thicknesses of horizontally extending and vertically extending portions of said source and drain impurities regions are substantially same.

7. The lateral MOSFET according to claim 6, wherein the width of the lower trench is substantially same as the depth of the lower trench.

* * * * *